(12) United States Patent
Tsorng et al.

(10) Patent No.: US 11,758,679 B2
(45) Date of Patent: Sep. 12, 2023

(54) TOOL-LESS SUPPORT FRAME FOR ELECTRONIC COMPONENT

(71) Applicant: Quanta Computer Inc., Taoyuan (TW)

(72) Inventors: Yaw-Tzorng Tsorng, Taoyuan (TW); Ming-Lung Wang, Taoyuan (TW); Hung-Wei Chen, Taoyuan (TW); Liang-Ju Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 45 days.

(21) Appl. No.: 17/445,740

(22) Filed: Aug. 24, 2021

(65) Prior Publication Data

US 2023/0064689 A1  Mar. 2, 2023

(51) Int. Cl.
*H05K 7/14* (2006.01)
*H05K 7/18* (2006.01)

(52) U.S. Cl.
CPC ............. *H05K 7/1491* (2013.01); *H05K 7/18* (2013.01)

(58) Field of Classification Search
CPC .......... G06F 1/187; G06F 1/181; G06F 1/182; H05K 7/18; H05K 7/1491
See application file for complete search history.

(56) References Cited

U.S. PATENT DOCUMENTS

| 5,774,337 A * | 6/1998 | Lee ....................... H05K 9/0049 361/725 |
| 6,114,622 A * | 9/2000 | Draeger .................. G06F 1/181 361/753 |
| 6,560,114 B2 * | 5/2003 | Berry ................... H05K 7/1489 361/740 |
| 6,729,662 B2 * | 5/2004 | Wang ....................... E05C 1/04 292/42 |

(Continued)

FOREIGN PATENT DOCUMENTS

| CN | 107690254 A | 2/2018 | |
| DE | 20301440 U1 * | 7/2003 | ............. G06F 1/181 |
| TW | 201713198 A * | 4/2017 | ............. G06F 1/181 |

OTHER PUBLICATIONS

TW Office Action for Application No. 111104834, dated Oct. 20, 2022, w/ First Office Action Summary.

(Continued)

*Primary Examiner* — Patrick D Hawn
(74) *Attorney, Agent, or Firm* — NIXON PEABODY LLP

(57) ABSTRACT

Certain aspects of the present disclosure include a support frame having a rear side, a bottom section, a connector bracket, a first perimeter section, a second perimeter section, and a rotatable bracket. The bottom section defines a width of the support frame. The connector bracket extends upright from the bottom section. The first perimeter section and the second perimeter section extend upright from opposing ends of the bottom section. The first perimeter section and the (Continued)

second perimeter section are substantially parallel to the connector bracket. The rotatable bracket is rotatably coupled at one end to the first perimeter section. The rotatable bracket is configured, at another end, to removably couple to the connector bracket, thereby enclosing an opening when the rotatable bracket is in a closed configuration. The opening is defined by the first perimeter section, a portion of the bottom section, the connector bracket, and the rotatable bracket.

16 Claims, 9 Drawing Sheets

(56) References Cited

U.S. PATENT DOCUMENTS

| | | | |
|---|---|---|---|
| 7,016,190 B1 * | 3/2006 | Chang | G11B 33/124 248/221.11 |
| 7,894,208 B1 * | 2/2011 | Lin | G06F 1/187 361/730 |
| 8,199,511 B2 * | 6/2012 | Kim | H05K 7/1461 361/752 |
| 8,958,206 B2 * | 2/2015 | French, Jr. | G06F 1/181 361/679.58 |
| 9,456,515 B2 * | 9/2016 | Pecone | H05K 7/02 |
| 9,629,263 B2 * | 4/2017 | Katsaros | H05K 7/1489 |
| 9,785,205 B2 | 10/2017 | Lien et al. | |
| 9,795,050 B2 * | 10/2017 | Chen | H05K 7/1487 |
| 9,861,010 B2 * | 1/2018 | Campbell | H05K 7/20181 |
| 9,927,849 B1 * | 3/2018 | Lai | G06F 1/183 |
| 10,559,326 B1 * | 2/2020 | Lin | G11B 33/02 |
| 10,803,907 B2 * | 10/2020 | Schroeder | G11B 33/128 |
| 2010/0039007 A1 * | 2/2010 | Fan | H05K 7/1491 312/223.2 |
| 2014/0375196 A1 * | 12/2014 | Nguyen | H05K 5/03 29/592 |
| 2017/0060176 A1 * | 3/2017 | Lien | G06F 1/187 |

OTHER PUBLICATIONS

TW Search Report for Application No. 111104834, dated Oct. 20, 2022, w/ First Office Action.

* cited by examiner

TOOL-LESS SUPPORT FRAME FOR ELECTRONIC COMPONENT

FIELD OF THE INVENTION

The present invention relates generally to support frames, and more specifically, to tool-less support frames for electronic components.

BACKGROUND OF THE INVENTION

Typically, a traditional server chassis includes a component frame that is couplable to an electronic component (e.g., an electronic card) housed in the server chassis. For example, FIG. 1A is a front view of a prior art component frame 10, according to certain aspects of the present disclosure. The component frame 10 includes four outer brackets: the lower bracket 12, the upper bracket 14, the left side bracket 16, and the right side bracket 18. The component frame 10 also includes a middle bracket 20, which may be an input output bracket for an electronic component 40 (FIG. 1B). As shown in FIG. 1A, in such traditional design of the component frame 10, all parts making up the component frame 10 (i.e., the lower bracket 12, the upper bracket 14, the left side bracket 16, and the right side bracket 18) are molded to the middle bracket 20 as an integral piece. In addition, the component frame 10 is a closed structure, which ensures overall strength of the component frame 10. The component frame 10 forms a first window 30 and a second window 32.

Referring to FIG. 1B, an isometric view of the component frame 10 is shown as being coupled to the electronic component 40, according to certain aspects of the present disclosure. In this example, the electronic component 40 includes a plurality of cables 50 extending through the first window 30 and the second window 32. The plurality of cables 50 connects the electronic component 40 to other components and/or devices (not shown), such as one or more power supply units, graphic cards, network computing cards, etc. Because the component frame 10 is a closed structure, the electronic component 40 must be removed in the direction 60, which inevitably pulls the plurality of cables 50 from the other components and/or devices that the electronic component 40 may be connected to. Such abrupt disconnection of the plurality of cables 50 may cause disruption in the operation of the server system, if the electronic component 40 must be temporarily removed for any reason.

Thus, a need exists for an improved support frame that not only enhances the strength of the server chassis, but also allows easy removal and/or replacement of the electronic component to which the support frame is coupled. The present disclosure is directed to solving these problems and addressing other needs.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a support frame includes a rear side, a bottom section, a connector bracket, a first perimeter section, a second perimeter section, and a rotatable bracket. The rear side is configured to receive an electronic component. The bottom section defines a width of the support frame. The connector bracket extends upright from the bottom section. The first perimeter section and the second perimeter section extend upright from opposing ends of the bottom section. The first perimeter section and the second perimeter section are substantially parallel to the connector bracket. The rotatable bracket is rotatably coupled at one end to the first perimeter section. The rotatable bracket is configured, at another end, to removably couple to the connector bracket, thereby enclosing an opening when the rotatable bracket is in a closed configuration. The opening is defined by the first perimeter section, a portion of the bottom section, the connector bracket, and the rotatable bracket.

In some implementations, the support frame further includes a receiving cavity positioned within the connector bracket. The receiving cavity includes a protrusion for engaging an aperture of the rotatable bracket via either an interference fit or a snap fit. In some such implementations, the rotatable bracket is a first rotatable bracket and the support frame further includes a second rotatable bracket. The protrusion of the receiving cavity is a first protrusion and the receiving cavity further includes a second protrusion for engaging another aperture of the second rotatable bracket via either the interference fit or the snap fit, such that the second rotatable bracket is removably coupled to the connector bracket.

In some implementations, the support frame further includes a hinge coupling the first perimeter section to the rotatable bracket, such that the rotatable bracket is configured to rotate about the hinge.

In some implementations, the rotatable bracket is a first rotatable bracket and the support frame further includes a second rotatable bracket coupled to the second perimeter section. The second rotatable bracket is configured to removably couple to the connector bracket, thereby enclosing another opening when the second rotatable bracket is in a closed configuration. The another opening is defined by the second perimeter section, another portion of the bottom section, the connector bracket, and the second rotatable bracket. In some such implementations, the second rotatable bracket is a mirror image of the first rotatable bracket.

In some implementations, the support frame is installable on a server chassis, and the connector bracket is configured to connect the electronic component to a server associated with the server chassis. In some implementations, the support frame is installable on a computer case, and the connector bracket is configured to connect the electronic component to a computer associated with the computer case. In some implementations, the support frame is installable on a router shell, and the connector bracket is configured to connect the electronic component to a router associated with the router shell.

In some implementations, the support frame is configured to house within the connector bracket a pair of wings extending outward from the electronic component. In some implementations, the first perimeter section and the second perimeter section are configured to couple to and secure the electronic component. In some implementations, the connector bracket extends upright from the bottom section at about a midpoint along the bottom section. In some implementations, the opening is configured to allow a cable coupled to the electronic component to pass through the opening to a front side of the support frame, the front side being opposite to the rear side. In some implementations, the electronic component includes an electronic card.

According to certain aspects of the present disclosure, a method for removing or servicing an electronic component housed in a server chassis is disclosed as follows. A support frame is provided. The support frame is positioned along a front end of the server chassis. The support frame includes a rotatable bracket that is removably coupled to a connector bracket. The rotatable bracket is decoupled from the connector bracket. The rotatable bracket is rotated from a closed configuration to an open configuration. The electronic component is removed from the support frame.

In some implementations, the decoupling the rotatable bracket from the connector bracket includes lifting an end of the rotatable bracket that is in proximity to the connector bracket. In some such implementations, the support frame further includes a receiving cavity positioned within the connector bracket. The receiving cavity includes a protrusion for engaging an aperture of the rotatable bracket via either an interference fit or a snap fit. The decoupling the rotatable bracket from the connector bracket further includes disengaging the protrusion of the receiving cavity from the aperture of the rotatable bracket.

In some implementations, the support frame further includes a bottom section and a perimeter section. In the closed configuration of the rotatable bracket, the electronic component is connected to a computing device via a cable through an opening defined by the perimeter section, a portion of the bottom section, the connector bracket, and the rotatable bracket. The removing the electronic component from the support frame includes maintaining the connection between the electronic component and the computing device.

In some implementations, the rotatable bracket is a first rotatable bracket. The support frame further includes a bottom section, a perimeter section, and a second rotatable bracket that is removably coupled to the connector bracket. The method further includes rotating the second rotatable bracket from a closed configuration to an open configuration. In the closed configuration of the second rotatable bracket, the second rotatable bracket encloses an opening defined by the perimeter section, a portion of the bottom section, the connector bracket, and the second rotatable bracket. In some such implementations, in the closed configuration of the second rotatable bracket, the electronic component is connected to a computing device via a cable through the opening. The removing the electronic component from the support frame includes maintaining the connection between the electronic component and the computing device.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

Figure 1A:
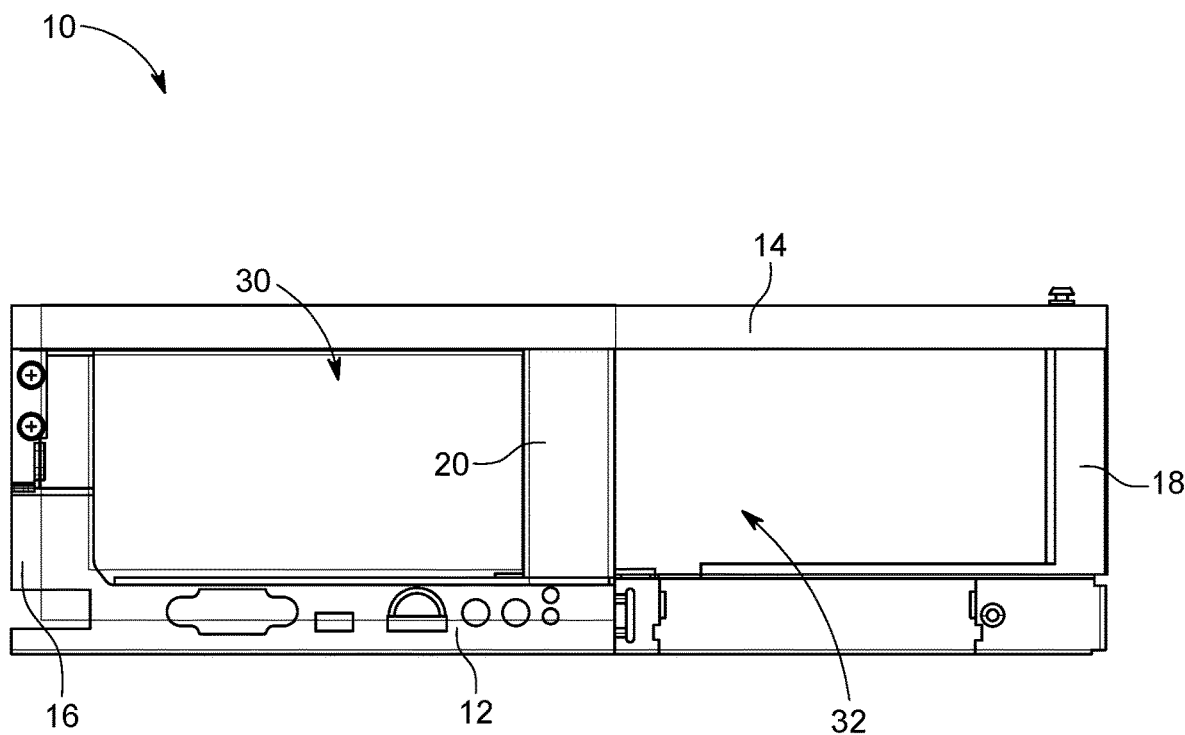
FIG. 1A is a front view of a prior art component frame, according to certain aspects of the present disclosure.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1B:
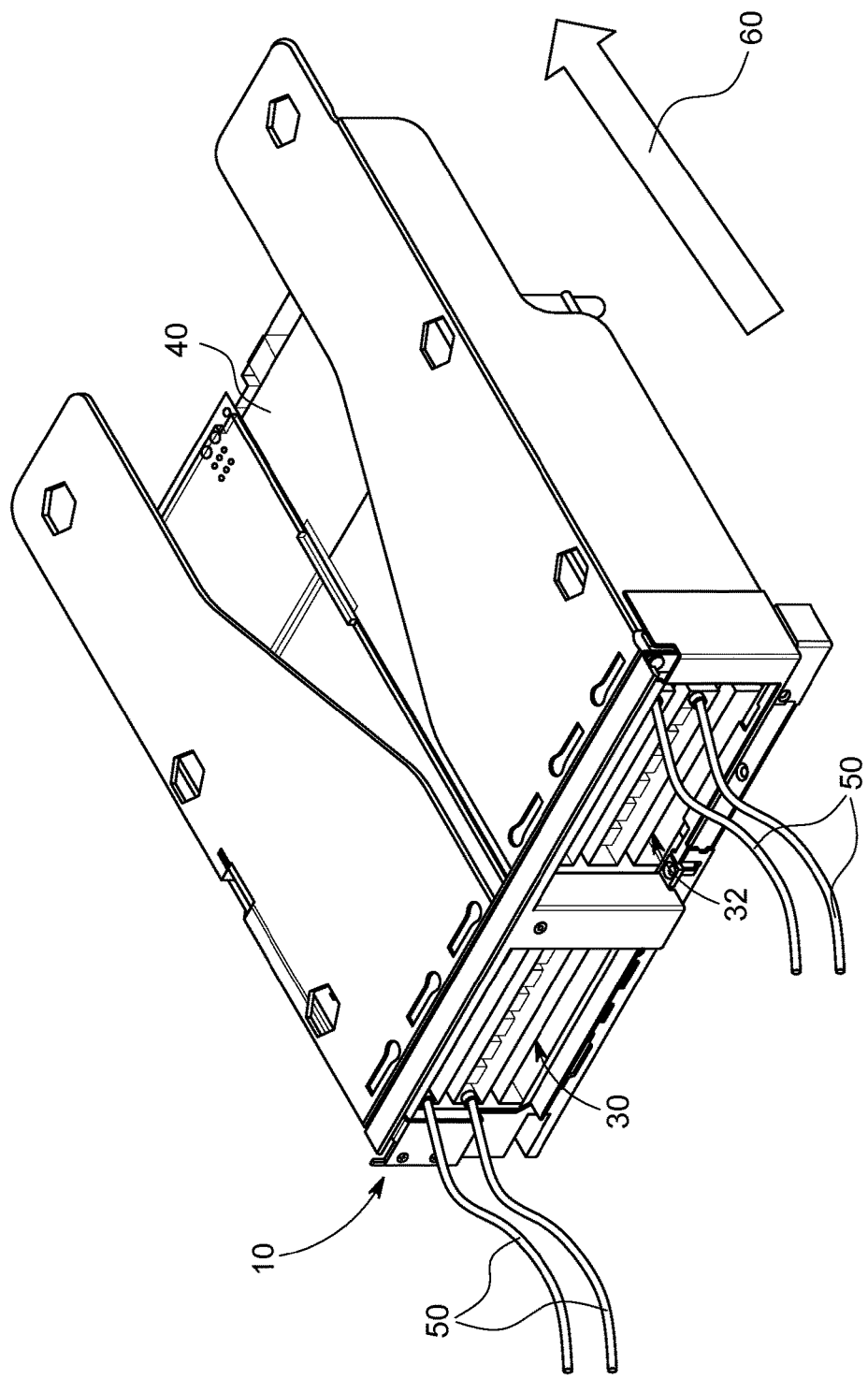
FIG. 1B is an isometric view of the prior art component frame of FIG. 1A coupled to an electronic component, according to certain aspects of the present disclosure.

As disclosed herein, a traditional server chassis includes a component frame (e.g., the component frame 10 in FIG. 1A) that is couplable to an electronic component (e.g., the electronic component 40 in FIG. 1B) housed in the server chassis. Referring briefly to FIG. 1B, because the traditional component frame 10 is a closed structure, the electronic component 40 must be removed in the direction 60, which inevitably pulls the plurality of cables 50 from the other components and/or devices that the electronic component 40 may be connected to. One solution to solve this problem is removing the upper bracket 14 from the component frame 10.

Figure 2A:
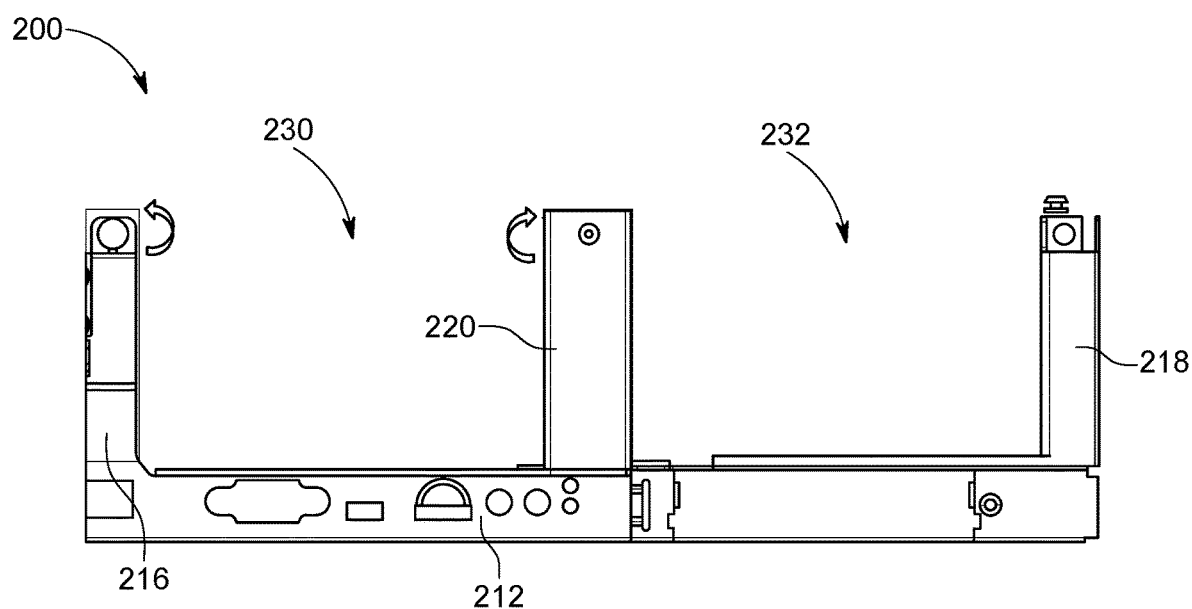
FIG. 2A is a front view of a modified component frame, according to certain aspects of the present disclosure.
Figure 2B:
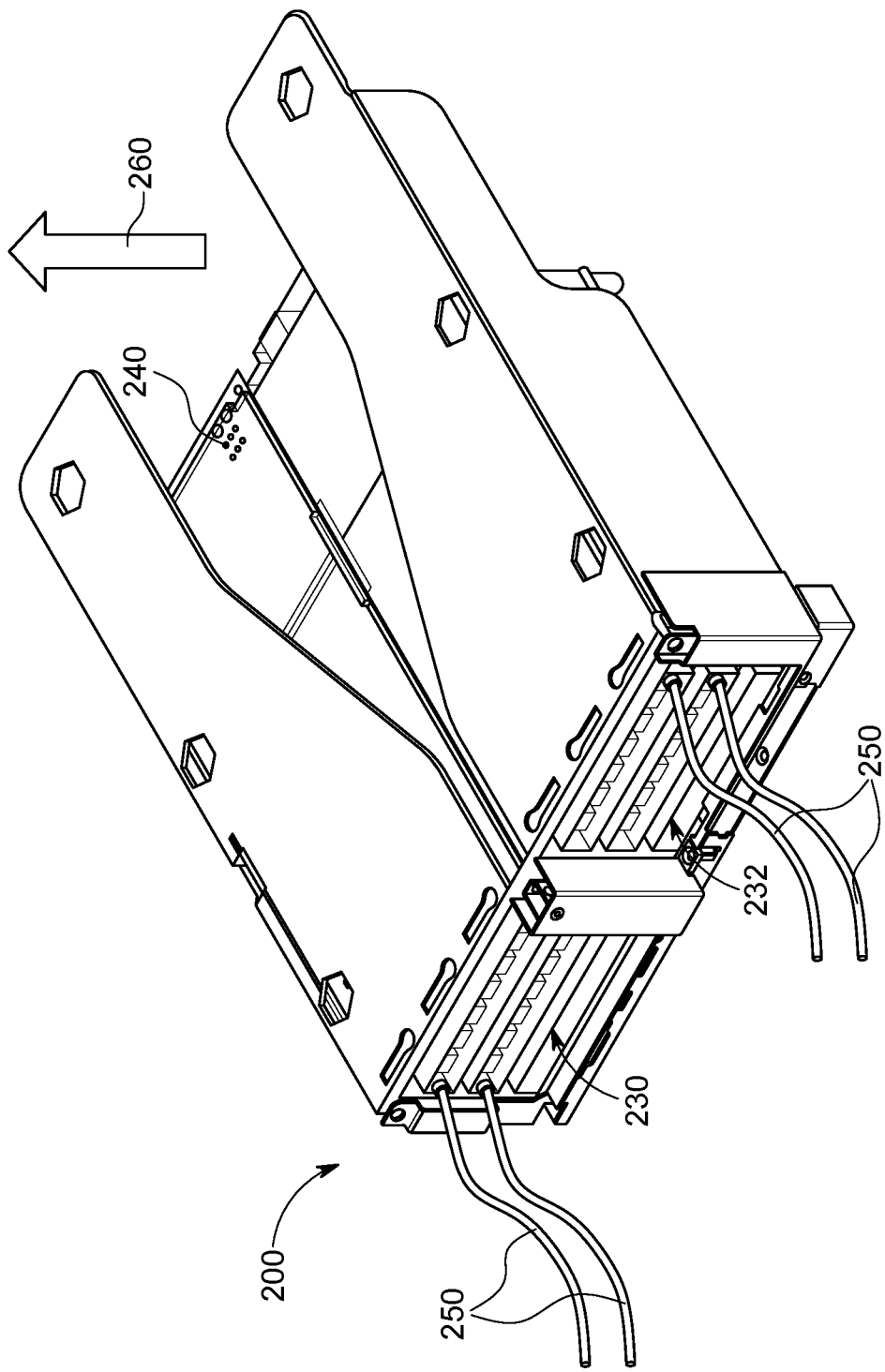
FIG. 2B is an isometric view of the modified component frame of FIG. 2A coupled to an electronic component, according to certain aspects of the present disclosure.

FIG. 2A is a front view of a modified component frame 200, according to certain aspects of the present disclosure. The component frame 200 includes three outer brackets: the lower bracket 212, the left side bracket 216, and the right side bracket 218. The component frame 200 also includes a middle bracket 220, which may be an input output bracket for an electronic component 240 (FIG. 2B). In some implementations, the lower bracket 212, the left side bracket 216, and the right side bracket 218 are molded to the middle bracket 220 as an integral piece. In contrast to the closed structure of the component frame 10 (FIG. 1A), the component frame 200 is an open structure. The component frame 200 forms a first U-shaped space 230 and a second U-shaped space 232.

Referring to FIG. 2B, an isometric view of the modified component frame 200 is shown as being coupled to the electronic component 240, according to certain aspects of the present disclosure. In this example, the electronic component 240 includes a plurality of cables 250 extending through the first U-shaped space 230 and the second U-shaped space 232. The plurality of cables 250 connects the electronic component 240 to other components and/or devices (not shown), such as one or more power supply units, graphic cards, network computing cards, etc. Because the component frame 200 is an open structure, the electronic component 240 can be removed from the component frame 200 in the direction 260, which allows the plurality of cables 50 to maintain the connection between the electronic component 240 and the other components and/or devices. This embodiment ensures that no disruption occurs in the operation of the server system.

Figure 3:
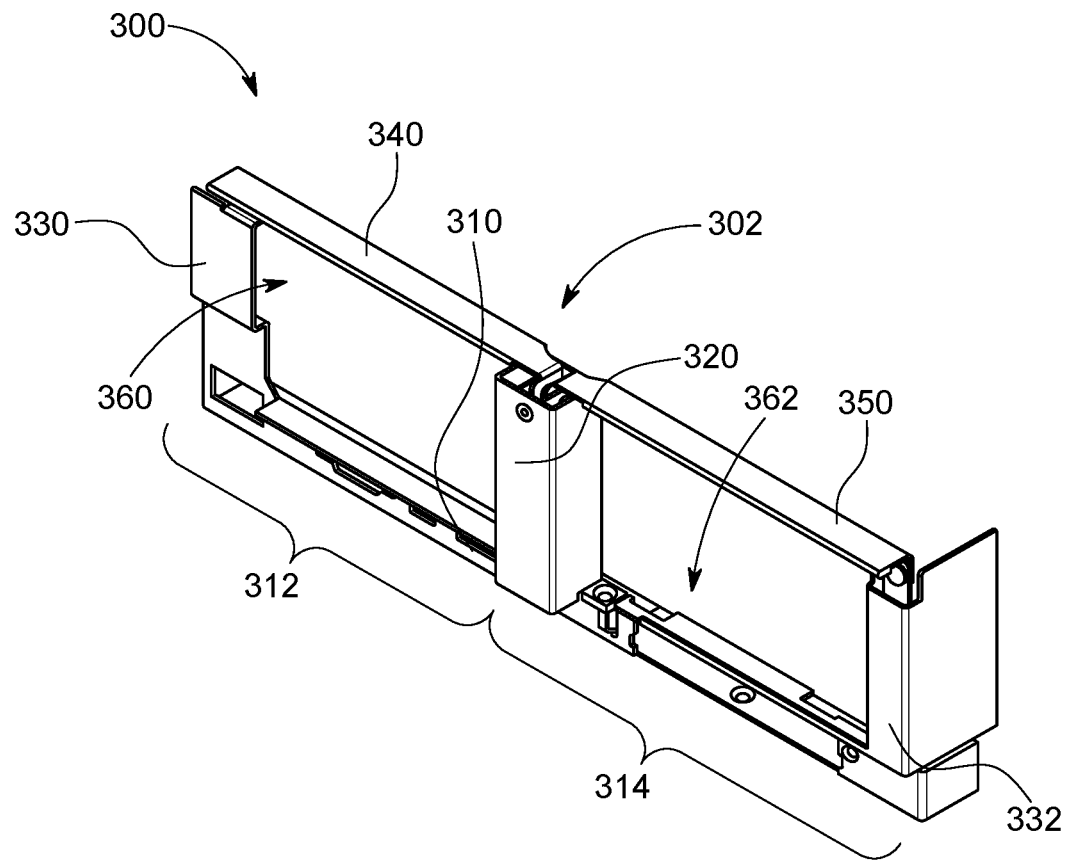
FIG. 3 is an isometric view of a support frame in a closed configuration, according to certain aspects of the present disclosure.

To further improve upon the modified component frame 200, the present disclosure provides a support frame that not only enhances the strength of the server chassis, but also allows easy removal, maintenance, and/or replacement of the electronic component to which the support frame is coupled. FIG. 3 shows an isometric view of such a support frame 300, according to certain aspects of the present disclosure. The support frame 300 is configured to receive the electronic component 640 (FIG. 6) at a rear side 302 of the support frame 300. The support frame 300 includes a bottom section 310, a connector bracket 320, a first perimeter section 330, a second perimeter section 332, a first rotatable bracket 340, and a second rotatable bracket 350. The bottom section 310 defines a width of the support frame 300. In some implementations, one or more components of the support frame 300 is made of Steel Galvanized Cold Common (SGCC) material. Additionally or alternatively, in some implementations, one or more components of the support frame 300 is made of any other suitable materials, such as other metal or plastic materials with at least a Rockwell hardness of 45.

The connector bracket 320 extends upright from the bottom section 310. In this example, the connector bracket 320 extends upright from the bottom section 310 at about a midpoint along the bottom section 310, although the connector bracket 320 may be positioned anywhere along the bottom section 310.

The connector bracket 320 is configured to provide connections to an electronic component 640 (FIG. 6), such as an electronic card. For example, in some such implementations, the connector bracket 320 is an input output bracket providing connections to an input output card. In some other such implementations, the connector bracket 320 is a PCBA bracket providing connections to a Printed Circuit Board Assembly (PCBA).

In some implementations, the support frame 300 is installable on a server chassis, and the connector bracket 320 is configured to connect the electronic component to a server associated with the server chassis. In some implementations, the support frame 300 is installable on a computer case, and the connector bracket 320 is configured to connect the electronic component to a computer associated with the computer case. In some implementations, the support frame 300 is installable on a router shell, and the connector bracket 320 is configured to connect the electronic component to a router associated with the router shell.

Figure 6:
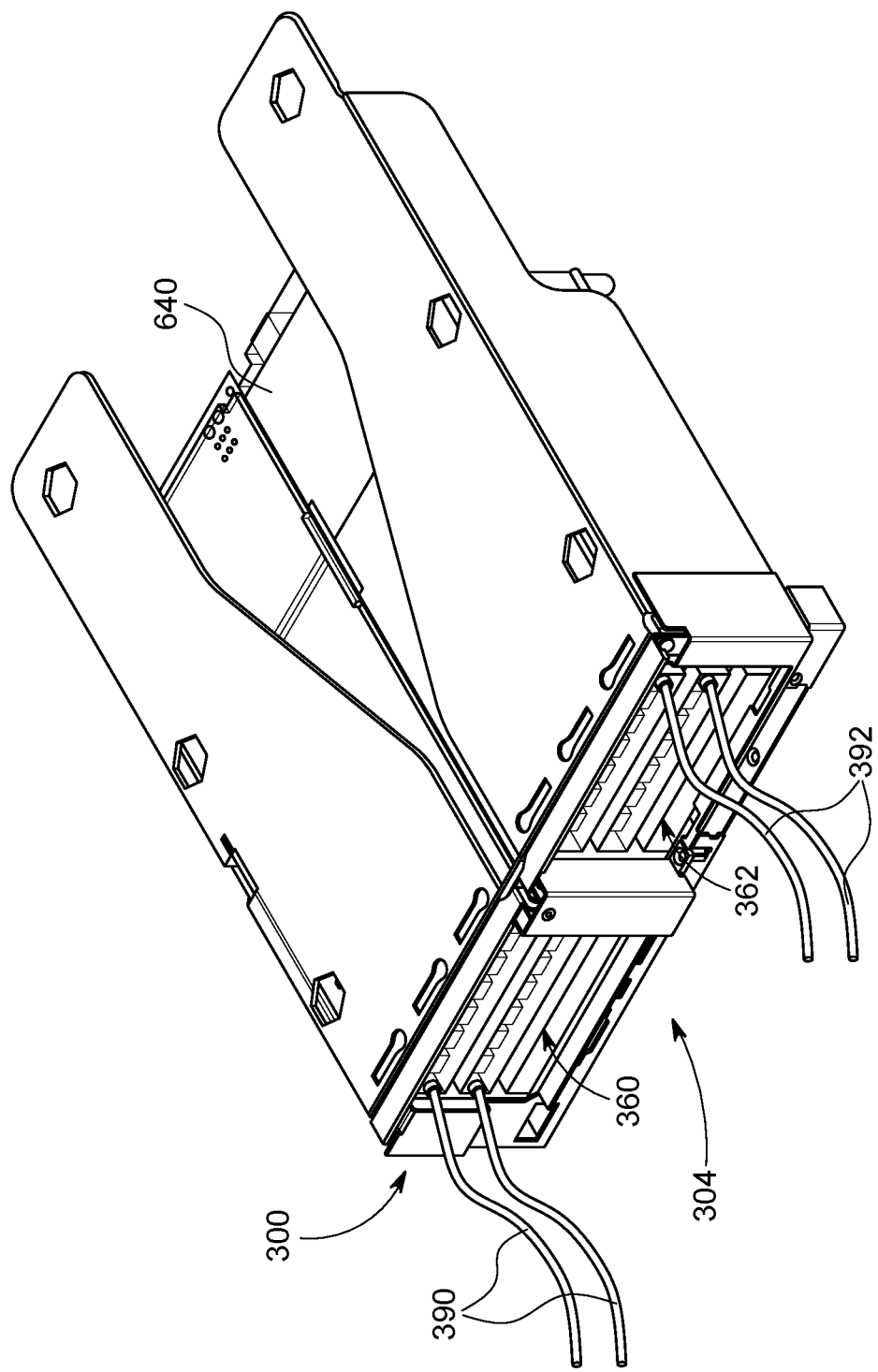
FIG. 6 is an isometric view of the support frame of FIG. 3 coupled to an electronic component, according to certain aspects of the present disclosure.

The first perimeter section 330 and the second perimeter section 332 extend upright from opposing ends of the bottom section 310. In this example, the first perimeter section 330 and the second perimeter section 332 are substantially parallel to the connector bracket 320. In some implementations, the first perimeter section 330, the second perimeter section 332, or both are configured to couple to and secure the electronic component 640 (FIG. 6).

The first rotatable bracket 340 is coupled to the first perimeter section 330. In addition, the first rotatable bracket 340 is configured to removably couple to the connector bracket 320, thereby enclosing a first opening 360. In other words, the first opening 360 is defined and/or bound by the first perimeter section 330, a first portion 312 of the bottom section 310, the connector bracket 320, and the first rotatable bracket 340.

In some implementations, the second rotatable bracket 350 is a mirror image of the first rotatable bracket 340. For example, the second rotatable bracket 350 is coupled to the second perimeter section 332. In addition, the second rotatable bracket 350 is configured to removably couple to the connector bracket 320, thereby enclosing a second opening 362. In other words, the second opening 362 is defined and/or bound by the second perimeter section 332, a second portion 314 of the bottom section 310, the connector bracket 320, and the second rotatable bracket 350.

Figure 4:
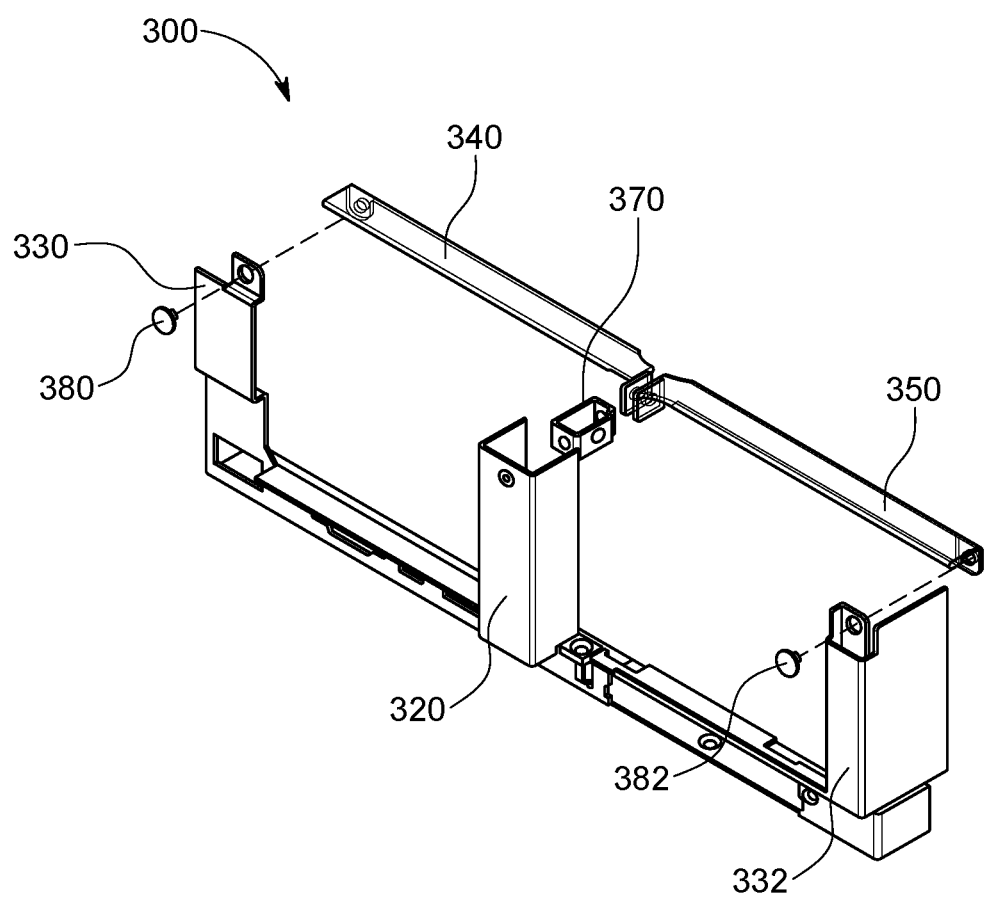
FIG. 4 is an exploded view of the support frame of FIG. 3, according to certain aspects of the present disclosure.

FIG. 4 is an exploded view of the support frame 300, according to certain aspects of the present disclosure. The support frame 300 shown in FIG. 4 is the same as, or similar to, the support frame 300 shown in FIG. 3, where same reference numerals designate equivalent elements. In some implementations, the support frame 300 includes a receiving cavity 370 positioned within the connector bracket 320. In some implementations, the support frame 300 further includes a first hinge 380 coupling the first perimeter section 330 to the first rotatable bracket 340, such that the first rotatable bracket 340 is configured to rotate about the first hinge 380. Similarly, the support frame 300 may also include a second hinge 382 coupling the second perimeter section 332 to the second rotatable bracket 350, such that the second rotatable bracket 350 is configured to rotate about the second hinge 382. While it is shown in FIG. 4 that the support frame 300 includes the first hinge 380 and the second hinge 382 as the coupling mechanism between the first rotatable bracket 340 and the first perimeter section 330, and between the second rotatable bracket 350 and the second perimeter section 332, respectively, the support frame of the present disclosure can include any suitable coupling mechanisms that allow the rotation of the first rotatable bracket 340 and the second rotatable bracket 350.

Figure 5:
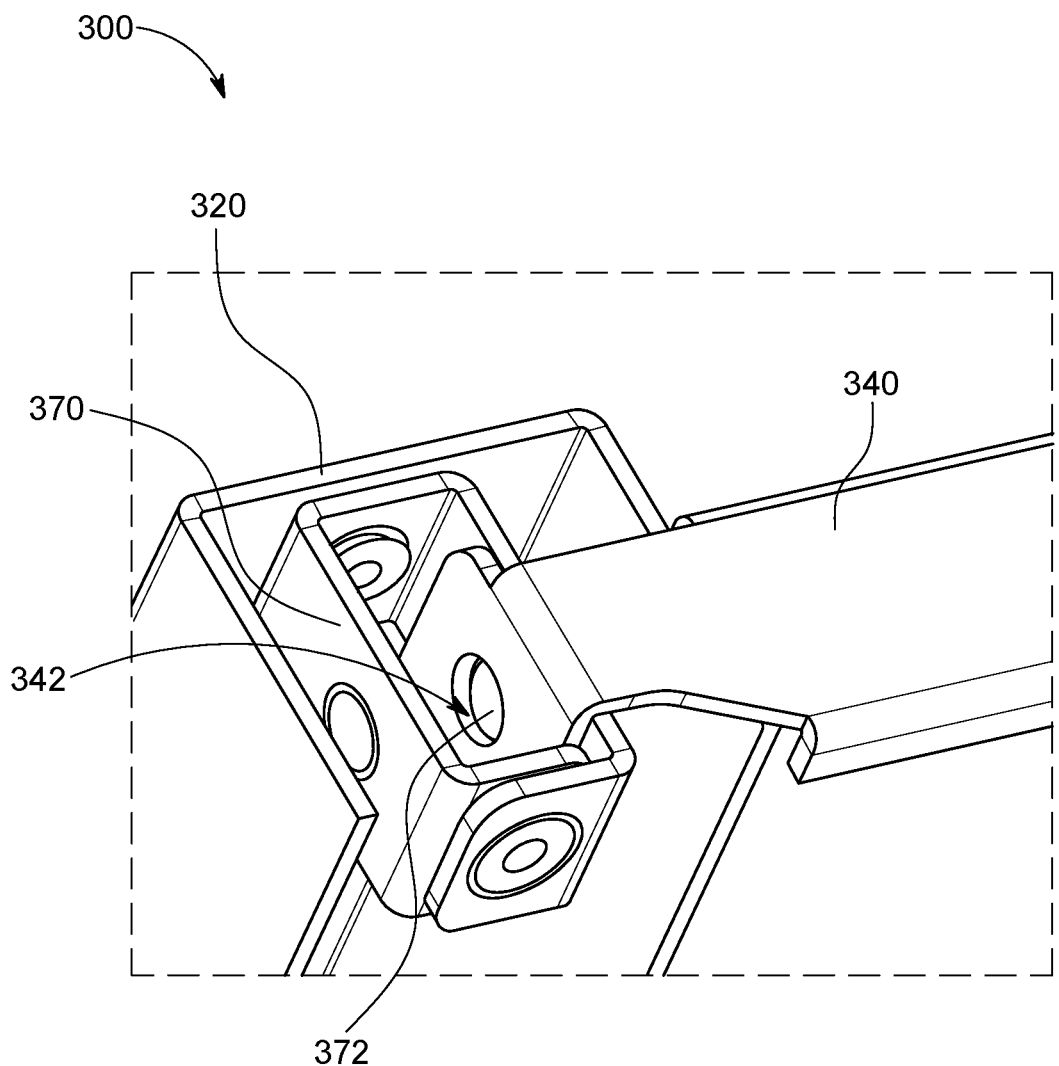
FIG. 5 is an isometric view of a receiving cavity of the support frame of FIG. 3, according to certain aspects of the present disclosure.

Referring to FIG. 5, an isometric view of the receiving cavity 370 of the support frame 300 is shown, according to certain aspects of the present disclosure. The receiving cavity 370 is positioned within the connector bracket 320. The receiving cavity 370 includes a first protrusion 372 for engaging an aperture 342 of the first rotatable bracket 340 via interference fit or snap fit, such that the first rotatable bracket 340 is removably coupled to the connector bracket 320. In some implementations, similar to the construction used for coupling and decoupling the first rotatable bracket 340, the receiving cavity 370 also includes a second protrusion for engaging an aperture of the second rotatable bracket 350 (FIG. 4) via interference fit or snap fit, such that the second rotatable bracket 350 (FIG. 4) is removably coupled to the connector bracket 320.

Referring to FIG. 6, an isometric view of the support frame 300 is shown as being coupled to the electronic component 640, according to certain aspects of the present disclosure. The support frame 300 shown in FIG. 6 is the same as, or similar to, the support frame 300 shown in FIG. 3, where same reference numerals designate equivalent elements. As shown in FIG. 6, the support frame 300 is in a closed configuration. In the closed configuration, the overall structural strength of the support frame 300 is strong and stable, and is enhanced compared to the open structure of the component frame 200 (FIG. 2A).

In some implementations, the first opening 360 of the support frame 300 is configured to allow a first set of cables 390 (coupled to the electronic component 640) to pass through the first opening 360 to a front side 304 of the support frame 300. The front side 304 is the side that is opposite to the rear side 302 (FIG. 3) of the support frame 300. Additionally or alternatively, in some implementations, the second opening 362 is configured to allow a second set of cables 392 (coupled to the electronic component 640) to pass through the second opening 362 to the front side 304 of the support frame 300. The first set of cables 390, and/or the second set of cables 392, connects the electronic component 640 to other components and/or devices (not shown), such as one or more power supply units, graphic cards, network computing cards, etc.

Figure 7:
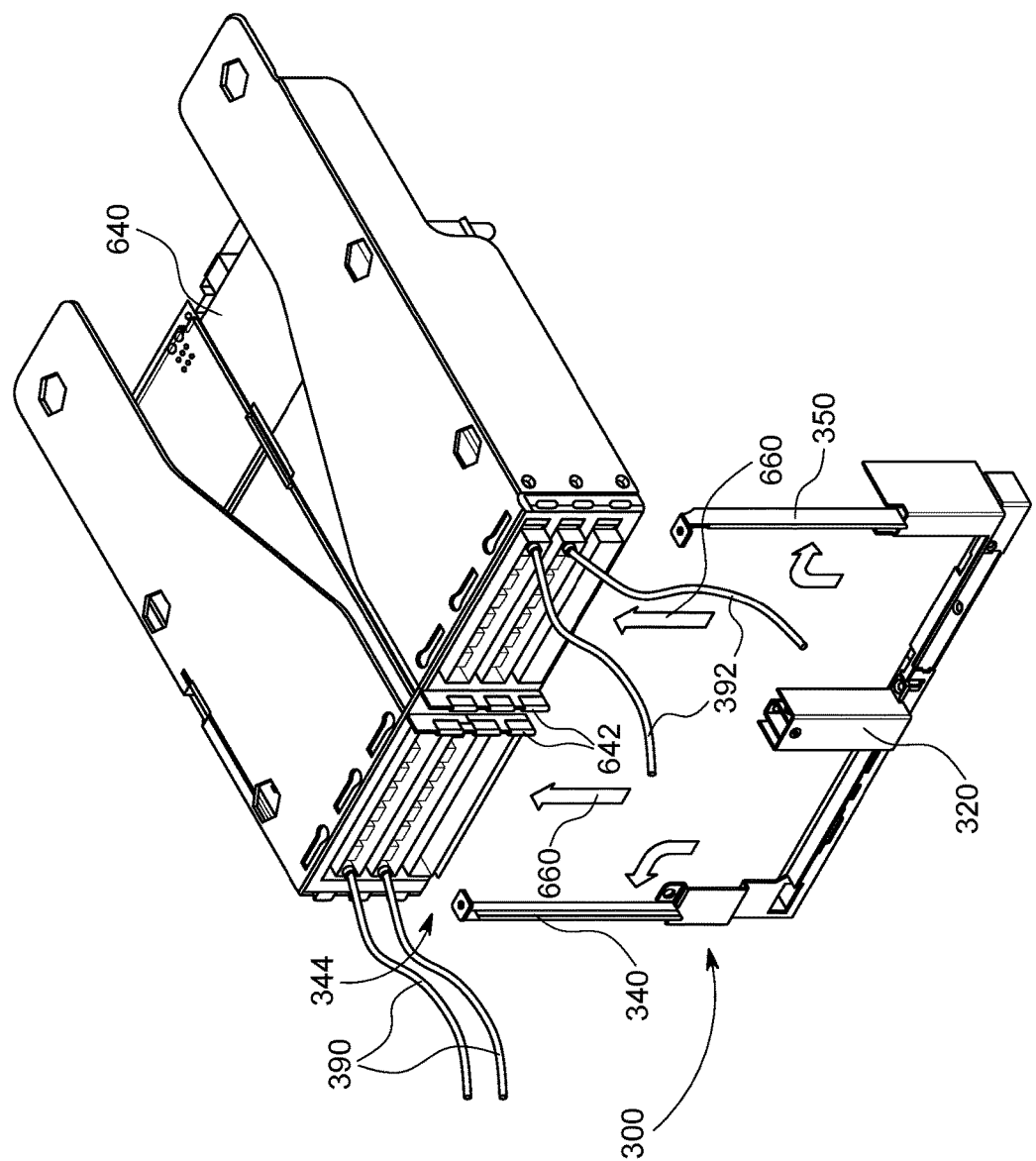
FIG. 7 is an isometric view of the electronic component of FIG. 6 decoupled from the support frame, according to certain aspects of the present disclosure.

In some implementations, the support frame 300 is configured to switch between the closed configuration (FIG. 6) and the open configuration (FIG. 7). FIG. 7 is an isometric view of the electronic component 640 in the open configuration, according to certain aspects of the present disclosure. The support frame 300 shown in FIG. 7 is the same as, or similar to, the support frame 300 shown in FIG. 3, where same reference numerals designate equivalent elements. In addition, the electronic component 640 shown in FIG. 7 is the same as, or similar to, the electronic component 640 shown in FIG. 6, where same reference numerals designate equivalent elements.

In order to switch from the closed configuration (FIG. 6) to the open configuration, the first rotatable bracket 340 and the second rotatable bracket 350 are rotated away from the connector bracket 320. In this example, the first rotatable bracket 340 and the second rotatable bracket 350 are rotated about 90 degrees away from the connector bracket 320, around the first hinge 380 and the second hinge 382, respectively.

In some implementations, the electronic component 640 may need to be removed from the support frame 300. For example, in some such implementations, the electronic component 640 may need to be replaced, or temporarily removed for service or maintenance. First, the first rotatable bracket 340 and the second rotatable bracket 350 are decoupled from the connector bracket 320. Each of the first rotatable bracket 340 and the second rotatable bracket 350 is rotated from the closed configuration (FIG. 6) to the open configuration. For example, in some such implementations, the decoupling the first rotatable bracket 340 from the connector bracket 320 includes (i) disengaging the first protrusion 372 (FIG. 5) of receiving cavity 370 (FIG. 5) from the aperture 342 (FIG. 5) of the first rotatable bracket 340, and (ii) lifting an end 344 of the first rotatable bracket 340 that is in proximity to the connector bracket 320.

The second rotatable bracket 350 may be decoupled from the connector bracket 320 in a similar manner as that of the first rotatable bracket 340. The electronic component 640 can then be removed from the support frame 300 in the direction 660, which allows the first set of cables 390 and the second set of cables 392 to maintain the connection between the electronic component 640 and any other components and/or devices. Removing the electronic component 640 under the open configuration of the support frame 300 ensures no disruption in the operation of the electronic system (e.g., a server system, a computing system etc.). The support frame 300 is advantageous because the support frame 300 is configured to switch between the closed configuration (FIG. 6) and the open configuration. For example, as disclosed above, the closed configuration improves the overall structural strength of the support frame 300, while the open configuration allows flexible installation and/or removal of the electronic component 640.

Still referring to FIG. 7, in some implementations, installing the electronic component 640 to the support frame 300 from the top is additionally advantageous, because the support frame 300 can be configured to house within the connector bracket 320 a pair of wings 642 extending outward from the electronic component 640. The pair of wings 642 may include wirings and/or connections to the connector bracket 320. Thus, installing the electronic component 640 to the support frame 300 from the top allows (i) better alignment between the pair of wings 642 and any wirings and/or connections in the connector bracket 320, and (ii) less friction that could wear down these components. Similarly, removing the electronic component 640 from the support frame 300 in the direction 660 can also provide the same benefits.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A support frame comprising:
   a rear side configured to receive an electronic component having a front surface;
   a bottom section defining a width of the support frame;
   a connector bracket having a proximal end attached to the bottom section and an opposite distal end extending upright from the bottom section;
   a first perimeter section and a second perimeter section each having a proximal end attached to the bottom section and a distal end extending upright from opposing ends of the bottom section, the first perimeter section and the second perimeter section being substantially parallel to the connector bracket; and
   a rotatable bracket rotatably coupled at one end to the distal end of the first perimeter section, the rotatable bracket being configured at another end to removably couple to the connector bracket, the rotatable bracket having an open configuration and a closed configuration, the open configuration allowing the electronic component to be inserted from between the distal ends of the first perimeter section and the connector bracket to rest against the bottom section, and the closed configuration enclosing an opening defined by the first perimeter section, a portion of the bottom section, the connector bracket, and the rotatable bracket, wherein the bottom section abuts the front surface of the inserted electronic component and the opening provides direct access to the front surface of the electronic component.

2. The support frame of claim 1, further comprising a receiving cavity positioned within the connector bracket, the receiving cavity including a protrusion for engaging an aperture of the rotatable bracket via either an interference fit or a snap fit.

3. The support frame of claim 2,
   wherein the rotatable bracket is a first rotatable bracket and the support frame further includes a second rotatable bracket, and
   wherein the protrusion of the receiving cavity is a first protrusion and the receiving cavity further includes a second protrusion for engaging another aperture of the second rotatable bracket via either the interference fit or the snap fit, such that the second rotatable bracket is removably coupled to the connector bracket.

4. The support frame of claim 1, further comprising a hinge coupling the first perimeter section to the rotatable bracket, such that the rotatable bracket is configured to rotate about the hinge.

5. The support frame of claim 1, wherein the rotatable bracket is a first rotatable bracket and the support frame further includes a second rotatable bracket coupled to the second perimeter section, the second rotatable bracket being configured to removably couple to the connector bracket, thereby enclosing another opening when the second rotatable bracket is in a closed configuration, the another opening being defined by the second perimeter section, another portion of the bottom section, the connector bracket, and the second rotatable bracket.

6. The support frame of claim 5, wherein the second rotatable bracket is a mirror image of the first rotatable bracket.

7. The support frame of claim 1, wherein the support frame is installable on a server chassis, and wherein the connector bracket is configured to connect the electronic component to a server associated with the server chassis.

8. The support frame of claim 1, wherein the support frame is installable on a computer case, and wherein the connector bracket is configured to connect the electronic component to a computer associated with the computer case.

9. The support frame of claim 1, wherein the support frame is installable on a router shell, and wherein the connector bracket is configured to connect the electronic component to a router associated with the router shell.

10. The support frame of claim 1, wherein the support frame is configured to house within the connector bracket a pair of wings extending outward from the electronic component.

11. The support frame of claim 1, wherein the first perimeter section and the second perimeter section are configured to couple to and secure the electronic component.

12. The support frame of claim 1, wherein the connector bracket extends upright from the bottom section at about a midpoint along the bottom section.

13. The support frame of claim 1, wherein the opening is configured to allow a cable coupled to the electronic component to pass through the opening to a front side of the support frame, the front side being opposite to the rear side.

14. The support frame of claim 1, wherein the electronic component includes an electronic card.

15. A support frame assembly comprising:
   an electronic component having a front surface;
   a rear side;
   a bottom section defining a width of the support frame;

a connector bracket having a proximal end attached to the bottom section and an opposite distal end extending upright from the bottom section, the connector bracket holding the electronic component adjacent to the rear side;
a first perimeter section and a second perimeter section each having a proximal end attached to the bottom section and a distal end extending upright from opposing ends of the bottom section, the first perimeter section and the second perimeter section being substantially parallel to the connector bracket; and
a rotatable bracket rotatably coupled at one end to the distal end of the first perimeter section, the rotatable bracket being configured at another end to removably couple to the connector bracket, the rotatable bracket having an open configuration and a closed configuration, the open configuration allowing the electronic component to be inserted from between the distal ends of the first perimeter section and the connector bracket to rest against the bottom section, and the closed configuration enclosing an opening and holding the electronic component when the rotatable bracket is in a closed configuration, the opening being defined by the first perimeter section, a portion of the bottom section, the connector bracket, and the rotatable bracket and wherein the bottom section abuts the front surface of the inserted electronic component and the opening provides direct access to the front surface of the electronic component.

16. A support frame assembly comprising:
an electronic component
a rear side;
a bottom section defining a width of the support frame;
a connector bracket extending upright from the bottom section, the connector bracket holding the electronic component adjacent to the rear side wherein the connector bracket is an input output bracket providing electronic connections between the electronic component and a computer device;
a first perimeter section and a second perimeter section extending upright from opposing ends of the bottom section, the first perimeter section and the second perimeter section being substantially parallel to the connector bracket and
a rotatable bracket rotatably coupled at one end to the first perimeter section, the rotatable bracket being configured at another end to removably couple to the connector bracket, thereby enclosing an opening and holding the electronic component when the rotatable bracket is in a closed configuration, the opening being defined by the first perimeter section, a portion of the bottom section, the connector bracket, and the rotatable bracket and wherein the rotatable bracket has an open configuration allowing removal of the electronic component from the connector bracket.

* * * * *